(12) United States Patent
Yuan

(10) Patent No.: US 8,773,119 B2
(45) Date of Patent: Jul. 8, 2014

(54) SYSTEM FOR FIBER DC MAGNETO-OPTIC DETECTION AND METHOD THEREOF

(75) Inventor: Haijun Yuan, Shanghai (CN)

(73) Assignee: 3S Hi-Technologies Co., Ltd., Shanghai (CN)

( * ) Notice: Subject to any disclaimer, the term of this patent is extended or adjusted under 35 U.S.C. 154(b) by 215 days.

(21) Appl. No.: 13/519,967

(22) PCT Filed: Nov. 22, 2010

(86) PCT No.: PCT/CN2010/078968
§ 371 (c)(1),
(2), (4) Date: Jun. 29, 2012

(87) PCT Pub. No.: WO2011/079663
PCT Pub. Date: Jul. 7, 2011

(65) Prior Publication Data
US 2012/0274321 A1    Nov. 1, 2012

(30) Foreign Application Priority Data
Dec. 31, 2009 (CN) .......................... 2009 1 0202166

(51) Int. Cl.
*G01R 33/02* (2006.01)
*G01R 33/032* (2006.01)
*G01R 15/24* (2006.01)
*G01R 31/00* (2006.01)
*G01R 19/00* (2006.01)
*G02F 1/09* (2006.01)
*H01P 1/175* (2006.01)

(52) U.S. Cl.
CPC ............ *G01R 33/032* (2013.01); *G01R 15/246* (2013.01); *G01R 33/0322* (2013.01); *G01R 15/24* (2013.01); *G01R 15/245* (2013.01); *G01R 19/00* (2013.01); *G02F 1/09* (2013.01); *H01P 1/175* (2013.01)

USPC .......................... 324/244.1; 324/244; 324/96

(58) Field of Classification Search
CPC ............. G01R 15/246; G01R 33/0322; G01R 33/032; G01R 15/24; G01R 15/245; G01R 19/00; G02F 1/09; G01D 5/145; H01P 1/175
USPC .......... 324/76.11–76.83, 96, 244, 244.1, 260; 359/7, 8, 280, 281, 283, 576, 484.02, 359/484.03, 484.04, 484.05, 484.06, 359/484.07, 484.08, 484.09, 484.1; 250/225, 231 R
See application file for complete search history.

(56) References Cited

U.S. PATENT DOCUMENTS

| 4,539,521 | A | * | 9/1985 | Matsumoto | 324/244.1 |
| 4,956,607 | A | * | 9/1990 | Abe et al. | 324/244.1 |
| 5,619,367 | A | | 4/1997 | Iwatsuka et al. | |
| 2011/0267049 | A1 | * | 11/2011 | Yuan | 324/244.1 |

FOREIGN PATENT DOCUMENTS

| CN | 1963539 | 5/2007 |
| CN | 101074983 | 11/2007 |

(Continued)

*Primary Examiner* — Jermele M Hollington
*Assistant Examiner* — Raul Rios Russo
(74) *Attorney, Agent, or Firm* — Fay Sharpe LLP

(57) ABSTRACT

A system for fiber DC magneto-optic detection and method thereof are provided. The system comprises a power supply and signal processing module (400), an optical fiber device (200), a magneto-optic probe (100) and a reference device (300). The reference device (300) is mounted in the system, and the measured signal can be corrected via a reference magnetic field pulse signal generated by the reference device (300) so as to eliminate the influence that the environmental factors caused on the measurement, and to obtain accurate measurement data, thus improving measurement accuracy of the system.

13 Claims, 4 Drawing Sheets

(56) References Cited

FOREIGN PATENT DOCUMENTS

| | | |
|---|---|---|
| CN | 101403768 | 4/2009 |
| CN | 101458312 | 6/2009 |
| CN | 101769999 | 7/2010 |
| JP | 2004-77196 | 3/2004 |
| RU | 2321000 C2 | 3/2007 |

* cited by examiner

SYSTEM FOR FIBER DC MAGNETO-OPTIC DETECTION AND METHOD THEREOF

TECHNICAL FIELD OF THE INVENTION

The invention relates to the field of optical application, particularly to a system for fiber DC (direct current) magneto-optical detection and method thereof.

BACKGROUND

Because of the advantages of large capacity, high transmission efficiency and low electromagnetic radiation to environment, the DC transmission technology has been paid attention in the modern energy transmission of new generation. Due to the DC transmission, the current on the transmission line cannot be measured by the mutual induction device utilizing electromagnetic induction. How to measure the DC current becomes a technical problem. In the prior art, Hall effect is used for measuring the DC current, however this method has the defects of lower sensitivity, higher equipment cost and difficult high-voltage insulation.

Currently magneto-optic effects such as Faraday Effect are widely used in measurement of the electrical current and magnetic field. Magneto-optic glass, magneto-optic crystal or fiber is usually used for achieving Faraday Effect. Since the optical intensity of the carrier of the magneto-optic effect is a DC signal, it is difficult to maintain the signal unchanged in the life of several years, even more than ten years. If the DC magnetic field or current is measured using the magneto-optic effect, the problem will be raised since it is difficult to separate the electric current signal from the optical intensity signal.

In FIG. 1, a system for fiber magneto-optic detection in the prior art is shown comprising a power supply and signal processing module 400, a magneto-optic probe 100 and a conductive fiber device 200. The power supply and signal processing module 400 emits laser light which is transmitted to the magneto-optic probe 100 through the fiber device 200. The magneto-optic probe is designed to sense the magnetic field of the environment in which the magneto-optic probe 100 is located according to a certain optical principle such as Faraday Effect, and convert the magnetic field signal into optical signal. The optical signal is carried by the laser light and transmitted back to the power supply and signal processing module 400 via the fiber device 200. The power supply and signal processing module 400 performs data processing on the optical signal received, so as to obtain information at the relevant magnetic field at the point measured.

The measurement process shown in FIG. 1 may be described by the following equation:

$$I = I_0(1 + c_1 H) \quad (1)$$

where I represents the optical signal detected by an photo-electric detection device in the power supply and signal processing module 400; $I_0$ represents a parameter relating to the optical intensity of the emitted laser light and the transmission ratio; $c_1$ represents a magneto-optical parameter relating to the characteristics of the magneto-optical material and to the polarization detection mechanism of the magneto-optic probe 100; and H represents the magnetic field to be measured. In general, $I_0$ and $c_1$ may be affected by various environmental factors. If the magnetic field H to be measured is in the state of alternating current (AC), $c_1 H$ may be obtained by respectively measuring the DC component $I_0$ and the AC component $I_0 c_1 H$ and performing a division calculation. If $c_1$ does not vary following the temperature variation, the measured result may well represents the magnetic field to be measured, otherwise the influence to $c_1$ caused by the environmental factors needs to be eliminated. If the magnetic field H to be measured is in the state of DC, $I_0$ may not be removed when using the above method, causing the measurement result improper.

The inventor recognizes in developing the invention that various materials used in the magneto-optic measurement are always affected by the environmental factors such as temperature, stress or the intensity of the magnetic field to be measured, which will cause improper measurement. Especially, the inventor recognizes that when some material such as garnet crystal is used as a magneto-optic medium to measure the magnetic field, the microcosmic structure of magnetic domains inside the garnet crystal changes unpredictably when the crystal is subjected to a certain intensity of direct-current or alternating magnetic field, which affects the optical characteristics and leads to uncertain measurement results. In the art, there is no reasonable solution for resolving such problems.

SUMMARY OF THE INVENTION

The present invention aims to provide a system for fiber DC (direct current) magneto-optic detection and method thereof, which can eliminate the influence of the environmental factors so as obtain proper measurement data, etc.

In one aspect of the present invention, one embodiment of the present application provides a system for fiber magneto-optic detection comprising a power supply and signal processing module, a fiber device, a reference device and a magneto-optic probe, in which the power supply and signal processing module is used for transmitting laser light to the magneto-optic probe through the fiber device and for receiving by two paths the optical signal coming from the magneto-optic probe and carried on the laser light and converting respectively the two paths of optical signal into two paths of electric signal, and performing process on the two paths of electric signal based on a reference magnetic field pulse signal transmitted by the reference device, so as to obtain the magnetic field information and/or current information at the measurement point itself.

The fiber device is used for dividing the laser light coming from the power supply and signal processing module into two paths, transmitting respectively the two paths of laser light to the two ends of the magneto-optic probe and transmitting the optical signal coming from the magneto-optic probe to the power supply and signal processing module by two paths.

The reference device is used for generating a reference magnetic field pulse signal with known amplitude and shape at the measurement point.

The magneto-optic probe is used for detecting the magnetic field signal of the measurement point and converting the magnetic field signal into optical signal, in which the magnetic field signal is superposition of the reference magnetic field pulse signal and the magnetic field signal generated at the measurement point itself. The magneto-optic probe is further used for receiving the two paths of laser light and transmitting the optical signal after conversion by carrying the optical signal on the two paths of laser light respectively.

According to another aspect of the present invention, another embodiment of the present invention provides a method for fiber DC magneto-optic detection, which comprising:

a power supply and signal processing module transmitting laser;

a fiber device dividing the laser light into two paths and transmitting the two paths of laser light to the two ends of a magneto-optic probe respectively;

the magneto-optic probe receiving the two paths of laser light, detecting the magnetic field signal of the measurement point, converting the magnetic field signal into optical signal, and transmitting the optical signal after conversion by carrying the optical signal on the two paths of laser light respectively, in which the magnetic field signal is superposition of the reference magnetic field pulse signal and the magnetic field signal generated at the measurement point itself, and in which the reference magnetic field pulse signal is a signal with known amplitude and shape at the measurement point, which is generated by the reference device.

the fiber device transmitting the optical signal coming from the magneto-optic probe to the power supply and signal processing module by two paths;

the power supply and signal processing module receiving the optical signal coming from the magneto-optic probe by two paths, converting the two paths of optical signal into two paths of electric signal respectively, performing signal process on the two paths of electric signal based on a reference magnetic field pulse signal, thus obtaining the magnetic field information and/or current information at the measurement point itself.

The magneto-optic probe is used for detecting the magnetic field signal of the measurement point and converting the magnetic field signal into optical signal, in which the magnetic field signal are superposition of the reference magnetic field pulse signal and the magnetic field signal generated at the measurement point itself. The magneto-optic probe is further used for receiving the two paths of laser light and transmitting the optical signal which are converted and then carried by the two paths of laser light respectively.

The magneto-optic probe is used for detecting the magnetic field signal of the measurement point and converting the magnetic field signal into optical signal.

In the present invention, a reference device is employed for generating a reference magnetic field pulse signal, and the reference magnetic field pulse signal is used for correct the measure signal to obtain precise measurement data, improving the accuracy of the measurement of the system, and resolving the problem during the measurement of the high sensitivity and large magnitude DC current.

BRIEF DESCRIPTION OF THE DRAWINGS

The drawings form a part of the description and are provided for further understanding of the disclosure. The exemplary embodiments of the disclosure and the description thereof are used for explaining the present disclosure and are not intend to limit the present disclosure. In the drawings.

DETAILED DESCRIPTION

The present invention will be illustrated in detail with reference to the drawings in combination with the embodiments.

Embodiment 1

Figure 1:
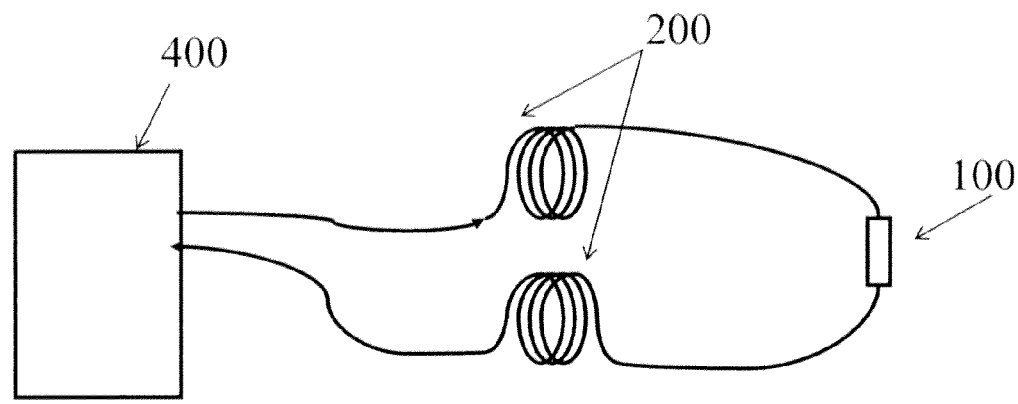
FIG. 1 illustrates a structural block diagram of an existing system for fiber magneto-optic detection.
Figure 2:
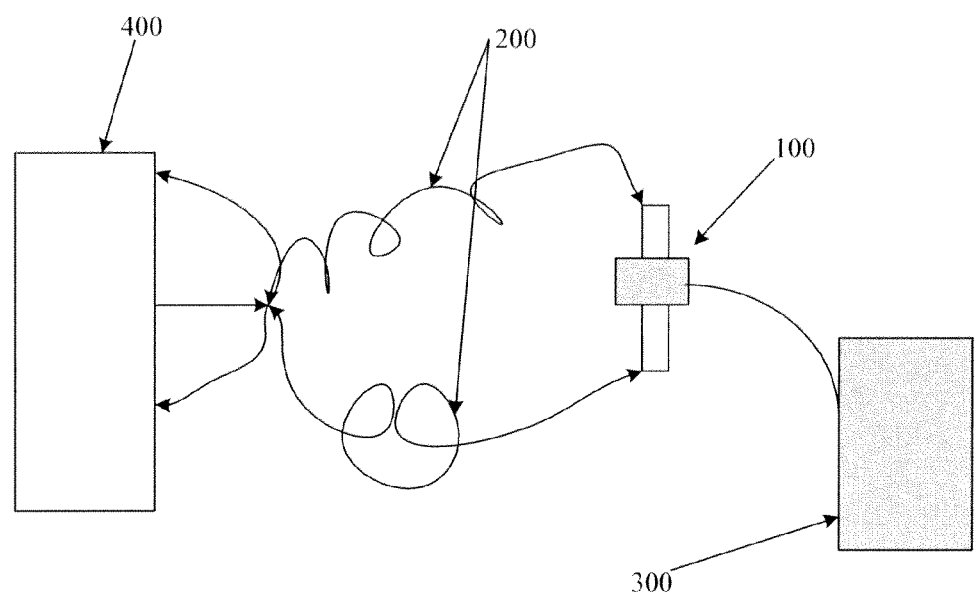
FIG. 2 illustrates a structural block diagram of a system for fiber DC magneto-optic detection according to Embodiment 1 of the present invention.

As shown in FIG. 2, the present embodiment provides a system for fiber DC magneto-optic detection, comprising: a magneto-optic probe 100, a fiber device 200, a reference device 300 and a power supply and signal processing module 400, in which the magneto-optic probe 100 and the reference device 300 are placed around a measurement point which may be located with a high electric potential, the power supply and signal processing module 400 is placed with a safe zero or low electric potential, and an insulated conductive fiber device 200 connects them.

The power supply and signal processing module 400 is used for sending laser light to the magneto-optic probe 100 through the fiber device 200, receiving the optical signal coming from the magneto-optic probe 100 and carried on the laser light by two paths and converting the two paths of optical signal into two paths of electric signal, and performing signal process on the two paths of electric signal based on a reference magnetic field pulse signal transmitted by the reference device 300, so as to obtain the magnetic field information and/or current information at the measurement point itself.

The fiber device 200 is used for dividing the laser light coming from the power supply and signal processing module 400 into two paths, transmitting respectively the two paths of laser light to the two ends of the magneto-optic probe 100 and transmitting to the power supply and signal processing module 400 by two paths the optical signal coming from the magneto-optic probe 100 and carried on the laser light.

The reference device 300 is used for generating a reference magnetic field pulse signal with known amplitude and shape at the measurement point.

The magneto-optic probe 100 is used for detecting the magnetic field signal of the measurement point and converting the magnetic field signal into optical signal, in which the magnetic field signal is superposition of the reference magnetic field pulse signal and the magnetic field signal generated at the measurement point itself. The magneto-optic probe is further used for receiving the two paths of laser light and transmitting the optical signal after conversion by carrying it on the two paths of laser light respectively.

In the present embodiment, a method for fiber DC magnetic field or electric current measurement may be employed based on Faraday Magneto-Optic Effect, in which the measurement results may be corrected in real-time. Therefore, the defects of lower sensitivity, higher equipment cost and difficult high-voltage insulation may be overcome.

In the system of the present embodiment, a reference device is used for generating a reference magnetic field pulse signal to correct the signal measured. By virtue of this, the influence to the measurement caused by the environmental factors may be eliminated and precise measurement data may be obtained. Meanwhile, in the system, an optical method is employed and an insulation body is applied in all the signal transmitting paths, therefore a safe isolation from the high-voltage power can be ensured.

Embodiment 2

Figure 3:
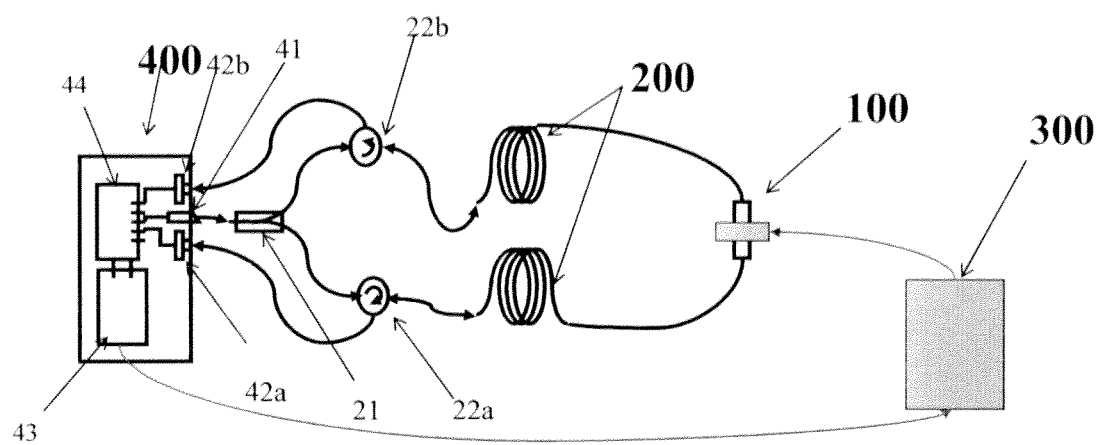
FIG. 3 illustrates a structural block diagram of a system for fiber DC magneto-optic detection according to Embodiment 2 of the present invention.

As shown in FIG. 3, the present embodiment provides a system for fiber DC magneto-optic detection, comprising: a magneto-optical probe 100, a fiber device 200, a reference device 300 and a power and signal processing module 400. The magneto-optic probe 100 and the reference device 300 are placed around a measurement point which may be located with a high electric potential, the power and signal processing module 400 is placed with a safe zero or low electric potential, and an insulated conductive fiber device 200 connects them.

The power and signal processing module 400 comprises at least a laser device 41, photoelectric detection devices 42a and 42b, and a control and signal processing module 44.

The laser device 41 is used for emitting laser o the magneto-optic module 100 through the fiber device 200;

The two photoelectric detection devices 42a and 42b are used for receiving respectively the optical signal coming from the magneto-optic probe 100 and carried by the laser respectively and converting the optical signal into electric signal respectively for transmission.

The control and signal processing module 44 is used for receiving the electric signal transmitted by the two photoelectric detectors 42a and 42b, and processing the electric signal based on the reference magnetic field pulse signal transmitted by the reference device 300, so as to obtain the magnetic field information and/or current information at the measurement point itself.

The fiber device 200 comprises several fibers connected with one another, a splitter 21 and two loopbacks 22a and 22b. The laser light emitted from the laser device 41 is split into two paths through the splitter 21, the two paths enter the magneto-optic probe 100 at the two ends thereof via the loopback 22a and 22b respectively, pass through the magnetic-sensitive material in the magneto-optic probe 100 in directions opposite with each other and exit at the other end. Then, the two paths are transmitted to the photoelectric detectors 42a and 42b via the loopbacks 22b and 22a, for photo-electric conversion. The reference device 300 is used for generating a reference magnetic field pulse signal at the measurement point which has known amplitude and shape and which does not vary following the variation of the environmental factors. The superposition of the reference magnetic field pulse signal and the DC magnetic field signal to be measured is sensed by the magneto-optic probe 100. Therefore, since the two paths of light pass through the magneto-optic probe 100 with a same path but in opposite directions, the signals detected by the photoelectric detectors 42a and 42b may be represented by the following equations:

$$I_a = I_{a0}[1 + c_1(H + H_r)] \quad (2)$$

$$I_b = I_{b0}[1 - c_1(H + H_r)] \quad (3)$$

where $I_a$ and $I_b$ represent the signals detected by the photoelectric detectors 42a and 42b respectively, $I_{a0}$ and $I_{b0}$ represent the parameters relating to the ratio of transmittance of the two optical paths, the split ratio of the splitter 21 and the sensitivity of the detectors, and etc., $c_1$ represents the magneto-optical sensitivity of the magneto-optic probe 100 under a certain environmental condition, H represents the magnetic field to be measured, and $H_r$ represents the reference pulse magnetic field, wherein the parameters $I_{a0}$, $I_{b0}$ and $c_1$ may be affected by the environmental factors.

Figure 4:
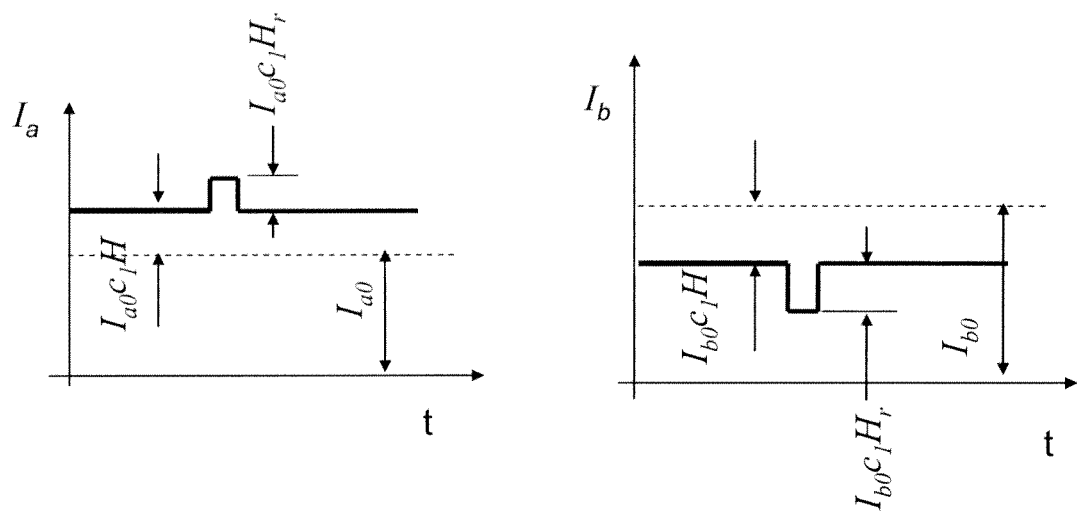
FIG. 4 illustrates the components of the signal detected by the photoelectric detection device used in Embodiment 2 of the present invention and the relationship among the components.

In FIG. 4, the relationship among the elements of the signals on the photoelectric detectors 42a and 42b is shown. From FIG. 4, it can be seen that the amplitudes $I_{ra}$ and $I_{rb}$ of the reference pulse magnetic field signal may be separated from the signal by the following equations:

$$I_{ra} = I_{a0}c_1H_r \quad (4)$$

$$I_{rb} = I_{b0}c_1H_r \quad (5)$$

Thus, the ratio of the amplitudes can be calculated as below:

$$r_{ab} = \frac{I_{a0}}{I_{b0}} = \frac{I_{ra}}{I_{rb}} \quad (6)$$

Then, a signal may be obtained by data processing based on the following equation, in which the signal is unrelated to the DC term which may be affected by the environmental factors:

$$S = I_a - I_b \cdot r_{ab} = I_{a0}c_1(H + Hr) \quad (7)$$

As shown in the following equation, the DC term in the signal S is represented by S, the pulse is represented by $S_r$. The two terms may be separated from each other, and the ratio between the magnetic field to be measured and the reference magnetic field can be obtained by division calculation between the two terms as follows:

$$S = I_{a0}c_1H \quad (8)$$

$$S_r = I_{a0}c_1H_r \quad (9)$$

$$r = \frac{S}{S_r} = \frac{H}{H_r} \quad (10)$$

Since the magnitude of the pulse of the reference magnetic field is constant, once the rate r is measured, the value of the magnetic field to be measured may be obtained. In the system of the present embodiment, after the data processing performed by the control and signal processing module 44, the parameters $I_{a0}$, $I_{b0}$ and $c_1$ which may be affected by the environmental factors can be removed and thus the measurement result only depends on the precision of the reference magnetic field pulse signal. The magnetic field to be measured can be determined by the reference magnetic field pulse signal, thus the accuracy of the measurement is improved.

Embodiment 3

Figure 5:
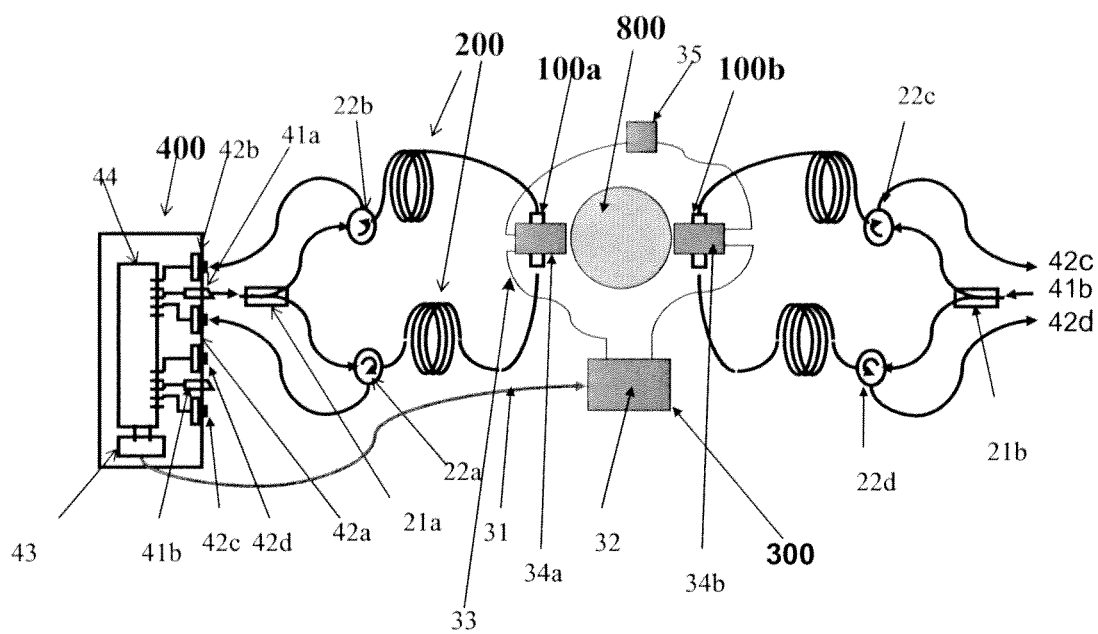
FIG. 5 illustrates a structural block diagram of a system for fiber DC magneto-optic detection according to Embodiment 3 of the present invention.

As shown in FIG. 5, the present embodiment provides a system for fiber optical apparatus comprising two magneto-optical probes 100a and 100b, a fiber device 200, a reference device 300 and a power supply and signal processing module 400, in which the magneto-optic probes 100a and 100b and the reference device 300 are placed around a measurement point 800 (such as a carrier conductor) which may be located with a high electric potential, the power and signal processing module 400 is placed with a safe zero or low electric potential, and an insulated conductive fiber device 200 connects them.

The power supply and signal processing module 400 in the present embodiment comprises: two laser devices 41a and 41b, a reference laser device 43, photoelectric detectors 42a, 42b, 42c and 42d, and a control and signal processing module 44. The reference laser device 43 can emit a reference laser light with given intensity and shape at a given moment according to the commands of the control and signal processing module 44. The given intensity is a predetermined optical intensity, which enables the reference device 300 to generate a magnetic field signal with high precision and high repeatability. In the system, the laser device 41a, the photoelectric detectors 42a and 42b constitute one set of optical processing sub-module, and the laser device 41b, the photoelectric detectors 42c and 42d constitute the other set of optical processing sub-module.

The magneto-optic probe 100 of the present embodiment comprises magneto-optic probes 100a and 100b which are symmetrically placed at the two sides of the measurement point 800 and which are used for sensing the magnetic field generated by the current in the measurement point 800. The DC current in the measurement point 800 directs in a direction perpendicular to the paper sheet, outward or inward.

The fiber device 200 comprises at least a fiber, a splitter and a loopback. In the present embodiment, the fiber device 200 comprises a fiber, two splitters 21a and 21b, and four loopbacks 22a, 22b, 22c and 22d. FIG. 5 shows the connection relationship among them, in which the fiber, the splitter 21a, and the loopbacks 22b constitute one set of transmission module, and the fiber, the splitter 21b, and the loopbacks 22c, 22d constitute the other set of transmission module.

The laser light emitted by the laser device 41a is introduced into the splitter 21a, and the splitter 21a equally divides the laser light into two paths. After passing through the loopbacks 22a and 22b, the two paths of laser light enter the magneto-optic probe 100a from the two ends thereof respectively, pass through the magnetic material of the magneto-optic probe 100a in directions opposite to each other, and exit from the other side. Thereafter, the two paths of laser light are transmitted by the loopbacks 22c and 22d to the photoelectric detectors 42a and 42b, for photoelectric conversion. Similarly, the laser light emitted by the laser device 41b is introduced into the splitter 21b, and the splitter 21b equally divides the laser light into two paths. After passing through the loopbacks 22c and 22d, the two paths of laser light enter the magneto-optic probe 100b from the two ends thereof respectively, pass through the magnetic material of the magneto-optic probe 100b in directions opposite to each other, and exit from the other side. Thereafter, the two paths of laser light are transmitted by the loopbacks 22c and 22d to the photoelectric detectors 42c and 42d, for photoelectric conversion.

The reference device 300 comprises a conductive fiber 31, a photoelectric conversion module 32, wires 33, coils 34a and 34b, and a temperature compensation element 35 (optionally). The conductive fiber 31 transmits the reference laser signal sent from the reference laser device 43 to the photoelectric conversion module 32. The photoelectric conversion module 32 converts a reference laser signal into a reference current signal. The coils 34a, 34b and the temperature compensation element 35 are connected in serial by the wires 33 and then connected in parallel to the current output end of the photoelectric conversion module 32. The coils 34a and 34b surround outside the magneto-optic probes 100a and 100b respectively. A given constant reference magnetic field signal may be generated when the optic current generated by the reference laser signal passes through the coils 34a and 34b. The magneto-optic probes 100a and 100b detect the linear superposition of the reference magnetic field pulse signal and the magnetic field to be measured. The temperature compensation element 35 is used for compensating the variation of the photoelectric tube resistance of the coils 34a and 34b caused by temperature variation, which variation causes in turn the drifting of the reference current.

According to the system mentioned above, the signals detected by the photoelectric detectors 42a, 42b, 42c and 42d may be described in following equations:

$$I_a = I_{a0}[1 + c_1(H_1 + H_{r1})] \quad (11)$$

$$I_b = I_{b0}[1 - c_1(I_1 + H_{r1})] \quad (12)$$

$$I_c = I_{c0}[1 + c_2(H_2 - H_{r2})] \quad (13)$$

$$I_d = I_{d0}[1 - c_2(I_2 - H_{r2})] \quad (14)$$

where $I_a$, $I_b$, $I_c$, $I_d$ represent the signals detected by the four photoelectric detectors 42a, 42b, 42c, and 42d respectively, $I_{a0}$, $I_{b0}$, $I_{c0}$, $I_{d0}$ represent the parameters relating to the transmission ratios of the four paths, splitting ratio of the splitter and the sensitivity of the detectors and etc.; $c_1$ and $c_2$ are the magneto-optical sensitivity parameters of the magneto-optic probes under an environmental condition of a certain moment; $H_1$ and $H_2$ represent the magnetic fields at the two magneto-optic probes generated by the DC current to be measured, in which the two magneto-optic probes 100a and 100b are symmetrically placed at the two sides of the measurement point 800 such that $H_1$ and $H_2$ may be similar but not necessarily equal with each other; $H_{r1}$ and $H_{r2}$ represent the reference magnetic field pulse signals generated by a same optical current, wherein due to the construction of the coils. $H_{r1}$ and $H_{r2}$ may be not fully identical, but they have a certain value respectively.

According to the signal processing method described in the present embodiment, the signals returning from the two magneto-optic probes may be processed respectively, and thus the ratio of the magnetic field to be measured and the reference magnetic field may be obtained as follows:

$$r_1 = \frac{S_1}{S_{r1}} = \frac{H_1}{H_{r1}} \quad (15)$$

$$r_2 = \frac{S_2}{S_{r2}} = \frac{H_2}{H_{r2}} \quad (16)$$

Therefore, measurement results which are not affected by the environmental factors and which are corresponding to the DC current in the measurement point 800 may be obtained as follows:

$$H_1 = r_1 H_{r1} \quad (17)$$

$$H_2 = r_2 H_{r2} \quad (18)$$

If an interference of an external magnetic field is considered for the measurement point 800, the magnetic field at the measurement point 800 will comprise the magnetic field generated by the current in the measurement point 800 and the interference of the external magnetic field, i.e.:

$$H_1 = \alpha_1 I + H_{dis} \quad (19)$$

$$H_2 = -\alpha_2 I + H_{dis} \quad (20)$$

where $I$ represents the current in the measurement point 800, $H_{dis}$ represents the interference external magnetic field, $\alpha_1$ and $\alpha_2$ are certain parameters. Differential calculation may be performed on the signal measured so as to remove the interference of the external magnetic field:

$$I = \frac{H_1 - H_2}{\alpha_1 + \alpha_2} = \frac{r_1 H_{r1} + r_2 H_{r2}}{\alpha_1 + \alpha_2} \quad (21)$$

Where $r_1$ and $r_2$ are obtained by the measurement, and $\alpha_1$, $\alpha_2$ and $H_{r1}$, $H_{r2}$ are known or predetermined values such that the DC current to be measured can be accurately obtained based on the parameters $r_1$ and $r^2$. In the practical operation, it is not necessary to measure $\alpha 1$, $\alpha 2$ and $Hr1$, $Hr2$. Since the equation (21) is given, calibration may be performed on the system by making use of the measurement value of another standard system.

A method for fiber DC magnetic field or electric current measurement is employed based on Faraday Magneto-Optic Effect, in which the measurement results may be corrected in real-time based on the reference magnetic field pulse signal. Therefore, the defects of lower sensitivity, higher equipment cost and difficult high-voltage insulation may be overcome. Furthermore, in the system, optical method is employed and insulation body is applied in all the signal transmitting paths, therefore a safe isolation from the high-voltage power can be ensured.

Embodiment 4

Figure 6:
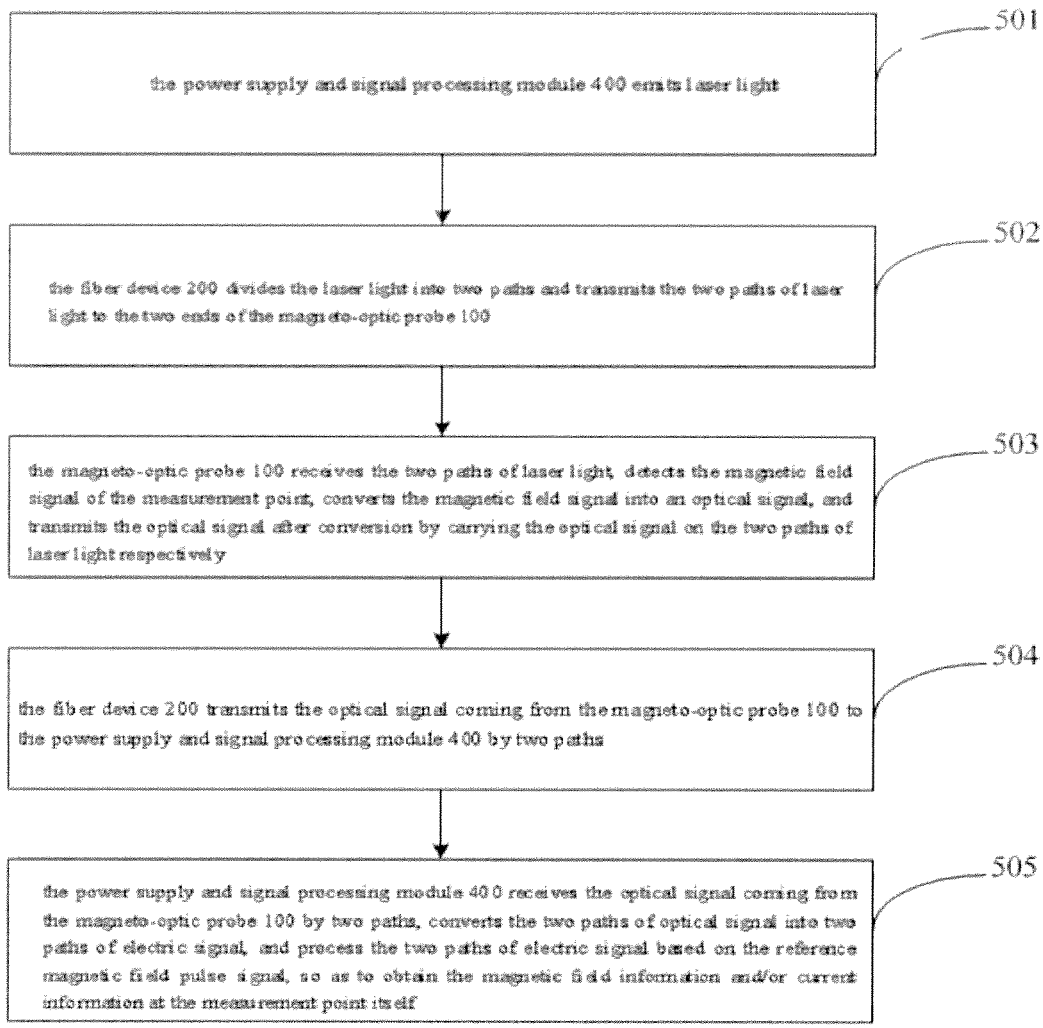
FIG. 6 illustrates a flow chart of a method for fiber DC magneto-optic detection according to Embodiment 4 of the present invention.

As shown in FIG. 6, the present embodiment provides a method for fiber DC magneto-optic detection. Now the method is to be explained with the combination with the system of Embodiment 1 as the example, and the method includes:

Step 501, the power supply and signal processing module 400 emits laser light;

Step 502, the fiber device 200 divides the laser light into two paths and transmits the two paths of laser light to the two ends of the magneto-optic probe 100;

Step 503, the magneto-optic probe 100 receives the two paths of laser light, detects the magnetic field signal of the measurement point, converts the magnetic field signal into an optical signal, and transmits the optical signal after conversion by carrying the optical signal on the two paths of laser light respectively, wherein the magnetic field signal is superposition of the reference magnetic field pulse signal and the magnetic field signal generated at the measurement point itself, and wherein the reference magnetic field pulse signal is a signal with known amplitude and shape at the measurement point which is generated by the reference device 300;

Step 504, the fiber device 200 transmits the optical signal coming from the magneto-optic probe 100 to the power supply and signal processing module 400 by two paths; and Step 505, the power supply and signal processing module 400 receives the optical signal coming from the magneto-optic probe 100 by two paths, converts the two paths of optical signal into two paths of electric signal, and process the two paths of electric signal based on the reference magnetic field pulse signal, so as to obtain the magnetic field information and/or current information at the measurement point itself.

A method for fiber DC magnetic field or electric current measurement is employed in the present embodiment based on Faraday Magneto-Optic Effect, in which the measurement results may be corrected in real-time based on the reference magnetic field pulse signal. Therefore, the defects of lower sensitivity, higher equipment cost and difficult high-voltage insulation may be overcome and relatively accurate measurement result can be obtained. Furthermore, in the system, optical method is employed and insulation is applied in the signal transmitting paths, therefore a safe isolation from the high-voltage power can be ensured.

In the embodiments all above, the material in the magneto-optic probe 100 for sensing the magnetic field may be magneto-optic glass, magneto-optic crystal or fiber per se. The number of the magneto-optic probes 100 used for measurement may be singular or plural. One set or more sets of photoelectric detector may be provided in the power supply and signal processing module 400 for detecting the incoming of the optical or electric signals, in which differential technologies may be applied in the photoelectric detectors. All those variations will not baffle the implementation of the systems according to the embodiments. Although the description is given by taking a magneto-optic crystal measurement system as example, various kinds of applications using the concept of the invention will be covered by the scope of the present invention.

From the above description, it may be understood that the above embodiments of the present invention can achieve beneficial technical effects:

A method for fiber DC magnetic field or electric current measurement is employed based on Faraday Magneto-Optic Effect, in which the measurement results may be corrected in real-time based on the reference magnetic field pulse signal. Therefore, the defects of lower sensitivity, higher equipment cost and difficult high-voltage insulation may be overcome and relatively accurate measurement result can be obtained. Furthermore, in the system, optical method is employed and insulation is applied in the signal transmitting paths, therefore a safe isolation from the high-voltage power can be ensured.

Obviously, the skilled in the art may understand that the above mentioned modules and steps may be implemented by a common computing device, and they may be integrated in one single computing device or distributed on the network constituted by several computing devices. Preferably, they may be achieved by the programmable codes executable by a computing device such that they may be stored in a storage means and processed by the computing device. Alternatively, they may be fabricated respectively as several individual integrated circuit modules, or some modules or steps among them may be fabricated as a single integrated circuit module. Therefore, the present invention shall not be limited on any specific superposition of hardware and software.

The above description is only for the preferred embodiments of the present invention and not used for limiting the invention. For one skilled in the art, the present invention may have various modifications and changes. Any modifications, equivalent replacements and improvements made within the spirit and principle of the present invention should be contained within the protection scope of the present invention.

The invention claimed is:

1. A system for fiber DC magnetic-optic detection, characterized in that, the system comprises a power supply and signal processing module, a fiber device, a reference device and a magneto-optic probe, wherein the power supply and signal processing module is used for transmitting laser light to the magneto-optic probe through the fiber device and for receiving by two paths the optical signal coming from the magneto-optic probe and carried on the laser light and converting respectively the two paths of optical signal into two paths of electric signal, performing process on the two paths of electric signal based on a reference magnetic field pulse signal transmitted by the reference device, so as to obtain the magnetic field information and/or current information at a measurement point itself;

the fiber device is used for dividing the laser light coming from the power supply and signal processing module into two paths, transmitting respectively the two paths of laser light to the two ends of the magneto-optic probe and transmitting the optical signal coming from the magneto-optic probe to the power supply and signal processing module by two paths;

the reference device is used for generating a reference magnetic field pulse signal with known amplitude and shape at the measurement point; and the magneto-optic probe is used for detecting the magnetic field signal of the measurement point and converting the magnetic field signal into optical signal, in which the magnetic field signal is superposition of the reference magnetic field pulse signal and the magnetic field signal generated at the measurement point itself, and wherein the magneto-optic probe is further used for receiving the two paths of laser light and transmitting the optical signal after conversion by carrying the optical signal on the two paths of laser light respectively.

2. The system according to claim 1, wherein the power supply and signal processing module comprises:
a laser device, sending laser light to the magneto-optic probe through the fiber device;
two photoelectric detectors, receiving respectively the optical signal coming from the magneto-optic probe and carried on the laser light, and converting the optical signal into electric signal respectively for transmission;
a control and signal processing module, receiving the electric signal transmitted by the two photoelectric detectors, and processing the electric signal based on the reference magnetic field pulse signal transmitted by the reference device so as to obtain the magnetic field information and/or current information at the measurement point itself.

3. A system according to claim 1, wherein the fiber device comprises:
splitter, used for dividing the laser light sent from the power supply and signal processing module into two paths;
a first loopback and a second loopback, used for transmitting the two paths of laser light transmitted by the splitter to the two ends of the magneto-optic probe respectively, and receiving respectively the optical signal which is transmitted by the magneto-optic probe and carried on the laser light and transmitting the optical signal to the power supply and signal processing module respectively.

4. The system according to claim 1, wherein the power supply and signal processing module comprises: two sets of optical processing sub-module, control and signal processing module and reference laser device, wherein
each of the two sets of optical processing sub-modules comprises:
a laser device, emitting laser light to a magneto-optic probe through the fiber device;
two photoelectric detectors, receiving respectively the optical signal coming from the magneto-optic probe and carried on the laser, and converting the optical signal into electric signal respectively for transmission;
a control and signal processing module, receiving the electric signal transmitted by the two sets of optical processing sub-modules, and processing the electric signal based on the reference magnetic field pulse signal transmitted by the reference device, so as to obtain the magnetic field information and/or current information at the measurement point itself;

a reference laser device, emitting a reference laser light signal with a known intensity to the reference device through the fiber device at the given moment;
the reference device is used correspondingly for generating a reference magnetic field pulse signal with known amplitude and shape at the measurement point based on the reference laser light signal;
the fiber device correspondingly comprises two sets of transmitting modules, in which each of the two sets of transmitting modules comprises:
Splitter, dividing the laser light coming from one set of optical processing sub-module into two paths; and
two loopbacks, transmitting the two paths of laser light coming from the splitter to the two ends of the magneto-optic probe respectively, and receiving the optical signal which is transmitted by the magneto-optic probe and carried on the laser light respectively and transmitting the optical signal to the power supply and signal processing module respectively; wherein
there are two magneto-optic probes which are symmetrically disposed at two sides of the measurement point.

5. The system according to claim 4, wherein
the reference device comprises:
photoelectric conversion module, for receiving the reference laser light signal from the power supply and signal processing module through a conductive fiber and converting the reference laser light signal into current signal for output; and
a first coil surrounding one magneto-optic probe and a second coil surrounding the other magneto-optic probe, in which the first coil and the second coil are connected in parallel by conductive wire to the current output end of the photoelectric conversion module, so as to receive the current signal, for generating the reference magnetic field pulse signal with known amplitude and shape.

6. The system according to claim 5, wherein
a temperature compensation element is connected between the first coil and the second coil for compensating the resistance drifting of the first coil and the second coil caused by temperature variation.

7. The system according to claim 1, wherein the material in the magneto-optic probe for sensing the magnetic field comprises magneto-optic glass, magneto-optical crystal or fiber.

8. The system according to claim 2, wherein the material in the magneto-optic probe for sensing the magnetic field comprises magneto-optic glass, magneto-optical crystal or fiber.

9. The system according to claim 3, wherein the material in the magneto-optic probe for sensing the magnetic field comprises magneto-optic glass, magneto-optical crystal or fiber.

10. The system according to claim 4, wherein the material in the magneto-optic probe for sensing the magnetic field comprises magneto-optic glass, magneto-optical crystal or fiber.

11. The system according to claim 5, wherein the material in the magneto-optic probe for sensing the magnetic field comprises magneto-optic glass, magneto-optical crystal or fiber.

12. The system according to claim 6, wherein the material in the magneto-optic probe for sensing the magnetic field comprises magneto-optic glass, magneto-optical crystal or fiber.

13. A method for fiber DC magneto-optic detection, characterized in that the method comprises:
a power supply and signal processing module emitting laser light;

a fiber device dividing the laser light into two paths and transmitting the two paths of laser light to the two ends of a magneto-optic probe respectively;

the magneto-optic probe receiving the two paths of laser light, detecting the magnetic field signal of the measurement point, converting the magnetic field signal into an optical signal, and transmitting the optical signal after conversion by carrying the optical signal on the two paths of laser light respectively, wherein the magnetic field signal is superposition of the reference magnetic field pulse signal and the magnetic field signal generated at the measurement point itself, and wherein the reference magnetic field pulse signal is a signal with known amplitude and shape at the measurement point which is generated by the reference device;

the fiber device transmitting the optical signal coming from the magneto-optic probe to the power supply and signal processing module by two paths; and the power supply and signal processing module receiving the optical signal coming from the magneto-optic probe by two paths, converting the two paths of optical signal into two paths of electric signal respectively, and processing the two paths of electric signal based on the reference magnetic field pulse signal, so as to obtain the magnetic field information and/or current information at the measurement point itself.

\* \* \* \* \*